TRANSISTOR RING COUNTER WITH BISTABLE STAGES

Filed April 9, 1958

INVENTOR
F. P. PACE
BY
John E. Cassidy
ATTORNEY

United States Patent Office 2,957,091

Patented Oct. 18, 1960

2,957,091

TRANSISTOR RING COUNTER WITH BISTABLE STAGES

Frank P. Pace, Syosset, N.Y., assignor to Bell Telephone Laboratories, Incorporated, New York, N.Y., a corporation of New York Filed Apr. 9, 1958, Ser. No. 727,305

3 Claims. (Cl. 307—88.5)

Figure 1:
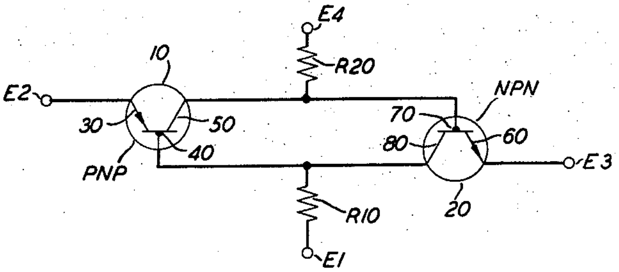

This invention relates to parallel bistable transistor circuits and more specifically to multistage counting circuits employing bistable junction transistor stages having a common source of current.

Combinations of parallel bistable transistor circuits have been employed in many types of applications such as, for example, ring counters. A ring counter is defined as a loop of interconnected bistable elements wherein one and only one element is in a specified state at a given time and the position of the element in the specified state moves in sequence around the loop of elements. Certain types of ring counters are characterized by the use of a plurality of bistable current-conducting transistor elements or stages having a common source of current. The current is supplied from the source to the ring through a resistor proportioned so as to provide a substantially constant current flow sufficient to maintain one stage in the conductive state but insufficient to maintain two stages conductive at a given time. However, due to variations in the characteristics of the transistors, such as the current amplification factors, the minimum current flow required to maintain each stage conductive and the leakage current flow of each nonconducting stage may vary sufficiently to permit two stages to be in the conductive state at the same time.

A general object of this invention is to provide improved performance characteristics for bistable transistor circuits having a common source of current.

Another general object is to provide an improved counting circuit which employs junction transistors.

Another object is to provide improved bistable transistor circuits which have greater uniformity of current flow despite variations in the characteristics of the transistors.

In accordance with the specific embodiment of the present invention, a ring counter is provided with a plurality of counter stages and each of the counter stages includes a pair of junction transistors of opposite conductivity type with the base of each connected to the collector of the other forming a "hook" connection, similar to the type of connection disclosed in Patent 2,655,609 granted to W. Shockley on October 13, 1953. In accordance with Patent 2,655,609, the "hook" connection provides bistable action wherein the circuit is transferable from a low current state to a high current state. In addition, in accordance with the present invention, the "hook" connection features means providing cut-off or back bias to the circuit whereby a predetermined threshold of current must be exceeded before the circuit can be transferred to the high conduction state thereby increasing the uniformity of current flow through the circuits in the high current state despite variations in the characteristics of the transistors. Moreover, the back bias means provides a sink for leakage currents eliminating the amplification of the leakage currents.

Another feature relates to means for inversely varying the common current supply with changes in the ambient temperature and thus compensating for the variations in the leakage currents of the bistable circuits due to temperature changes.

A further feature relates to means for transferring a predetermined stage to the high current state when none of the stages is in the high current state.

Figures 2, 3:
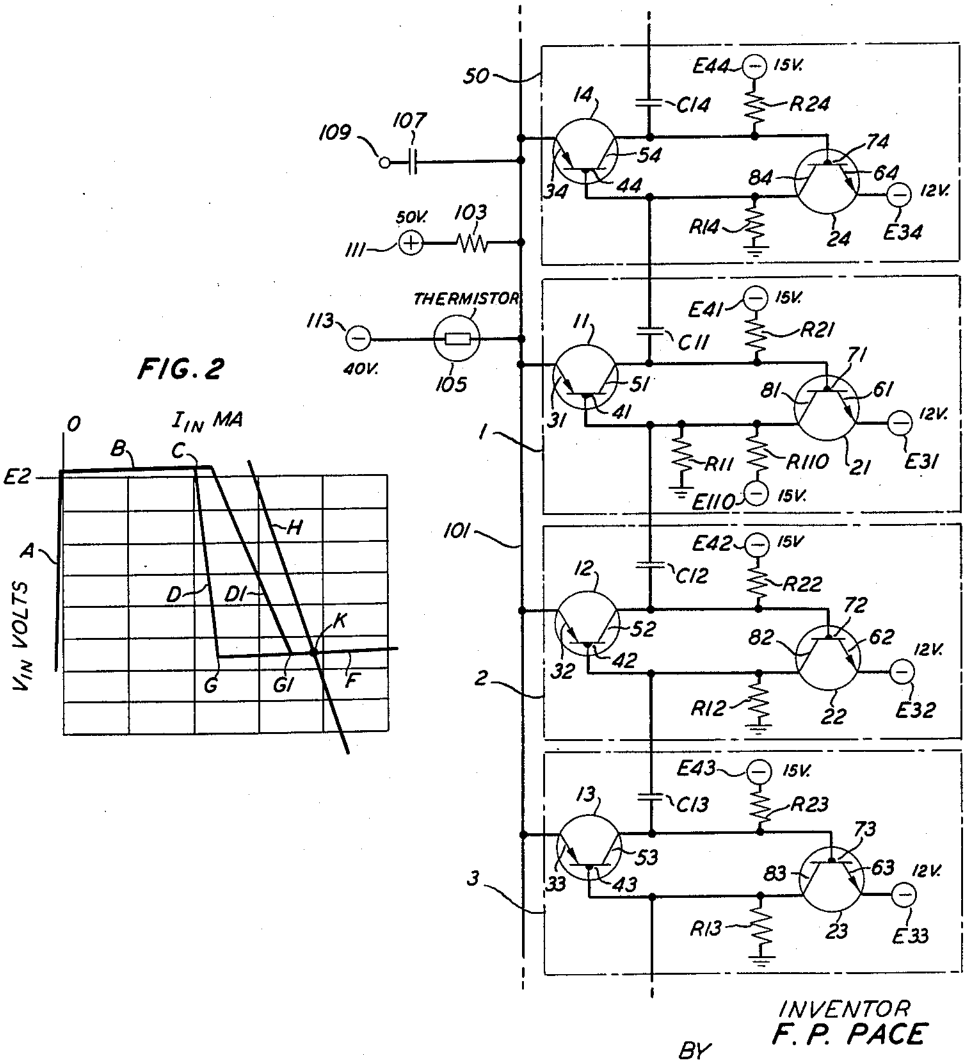

The means for fulfilling the foregoing objects and the practical embodiment of the features of this invention will be fully understood from the following detailed description taken in conjunction with the accompanying drawing wherein:

Fig. 1 shows a bistable transistor circuit suitable for use in accordance with this invention;

Fig. 2 portrays, in graph form, the typical characteristics of a bistable circuit constructed in accordance with this invention; and Fig. 3 illustrates a ring counter in accordance with this invention.

Referring now to Fig. 1, a bistable device is illustrated comprising a pair of junction transistors 10 and 20 of opposite conductivity type. Transistor 10 is a PNP junction transistor having an emitter 30, a base 40 and a collector 50 and transistor 20 is an NPN junction transistor having an emitter 60, a base 70 and a collector 80. Collector 50 and collector 80 are connected respectively to base 70 and base 40 to form the "hook" connection disclosed in the above-mentioned Shockley Patent 2,655,609. The two transistors 10 and 20, which advantageously have substantially similar performance characteristics, except for the difference in polarities, are connected between terminals E1, E2, E3 and E4. Terminal E2 and terminal E3 are connected respectively to the emitter 30 of transistor 10 and the emitter 60 of transistor 20. Terminal E1 is connected to base 40 and collector 80 through resistor R10 and terminal E4 is connected to collector 50 and base 70 through resistor R20.

When the circuit is in the off or nonconducting state, the voltage on terminals E1, E2, E3 and E4 preferably satisfy the inequality.

$$E1>E2>E3>E4 \quad (1)$$

Thus, the voltage on terminals E1 and E4 provide the reverse bias for collector 80 and collector 50, respectively. In addition, when the circuit is off or in the nonconducting state, terminal E4 provides cut-off or back bias for base 70 of transistor 20 since the terminal E4 voltage is negative relative to the terminal E3 voltage applied to emitter 60. This provides a current threshold for the circuit, when transistor 10 is turned on by increasing the terminal E2 voltage, for example, whereby the collector current of transistor 10 must exceed the current threshold before the voltage on base 70 of transistor 20 is positive enough, relative to the voltage on emitter 60, to turn transistor 20 on. The threshold current required to turn transistor 20 on is controlled by the magnitudes of resistor R20 and the back bias for base 70 as determined by the terminal E4 voltage.

For bistable action, the composite current amplification factor, alpha, or ratio of the circuit collector current to the circuit emitter current must exceed one though the individual alphas of junction transistors 10 and 20 are less than one. It is shown in the above-mentioned Shockley Patent 2,655,609 that terminals E2 and E3 function, respectively, as the emitter and the collector of the circuit and "hook" connected transistors constitute an equivalent transistor having an alpha given by the relation $$\text{Alpha}=\frac{\text{alpha (10)}}{1-\text{alpha (20)}} \quad (2)$$

where alpha (10) is the current amplification factor of transistor 10 and alpha (20) is the current amplification factor of transistor 20. It is, therefore, evident that the composite alpha is much greater than alpha (10) or alpha (20) and, for example, if both alpha (10) and alpha (20) are equal to .9, the composite alpha is equal to 9. The composite alpha becomes larger as alpha (10) and alpha (20) approach 1. In the circuit shown in Fig. 1, when transistor 10 turns on, the collector current of transistor 10 passes through resistor R20 to terminal E4 until the current threshold is reached and transistor 20 turns on.

From this point on, each incremental increase in the collector current of transistor 10 is applied to base 70 of transistor 20 and the ratio of the change of the circuit collector current (emitter current of transistor 20) to the circuit emitter current (emitter current of transistor 10) is governed by relation (2) until both transistors are saturated. This region, wherein the circuit alpha is greater than one, is defined as the negative resistance region.

When the composite circuit is off, resistor R20 and terminal voltage E4 provide a sink for the collector leakage current of transistor 10 and the base leakage current of transistor 20 and resistor R10 and terminal voltage E1 provide a source for the collector leakage current of transistor 20 and the base leakage current of transistor 10. Recalling the relationship of the voltages on terminals E1, E2, E3 and E4, it is apparent that the collector leakage current of transistor 10 must flow to terminal E4 by way of resistor R20 and is not applied to base 70 of transistor 20. In the same manner, the collector leakage current of transistor 20 is not applied to base 40 of transistor 10. Thus, no current leakage amplification takes place and the leakage current of the bistable circuit, viewed from terminal E2, is substantially equal to the leakage current of transistor 10 which may be of the order of $10^{-5}$ amperes.

The terminal E2 current voltage characteristic of the combination of transistors 10 and 20 is portrayed graphically in Fig. 2. The voltage, in volts, and the current, in milliamperes, is measured between terminals E2 and E1. The characteristic has a low-current, high-resistance, stable region A wherein as the voltage increases the low reverse leakage current decreases slightly until a "peak voltage," slightly in excess of the terminal E1 voltage, is reached whereupon transistor 10 turns on and the circuit goes into the current threshold region B. When the current threshold peak is reached at point C, transistor 20 turns on and the circuit passes abruptly from the current threshold region B, through a negative-resistance, unstable region D, to a high-current, low-resistance, stable region F.

The relationship between the change in the voltage and the change in the current or the slope of negative resistance region D for junction transistors having alphas between .9 and 1 is given by the approximate relation $$M=\frac{R10\text{ alpha }(10)\text{ alpha }(20)}{1-\text{alpha }(20)} \tag{3}$$

where R10 is the resistance, in ohms, of resistance R10 is shown in Fig. 1. Assuming a practical value of 750 ohms for resistance R10, if alpha (10) and alpha (20) approach one, then the slope approaches infinity, shown as negative resistance region D, and if alpha (10) and alpha (20) equal .9, then the relation between the change in voltage, in volts, and the change in current, in milliamperes, approximates six to one, shown as negative resistance region D1. Point G shows the minimum amount of current required to sustain the circuit in stable region F for high alpha transistors and point G1 shows the minimum amount of current required for low alpha transsistors. It is evident, from an inspection of Fig. 2, that the ratio of the minimum current requirements between low and high alpha circuits is in the order of seven to five whereas, in bistable circuits not having the current threshold property wherein the characteristic directly passes from the high resistance region A to the negative resistance region D or D1 without traversing the substantial threshold region B shifting regions D and D1 and points G and G1 substantially to the left toward the region A, the ratio of the minimum current requirements may exceed two to one. This current threshold property is utilized in a ring circuit shown in Fig. 3, which is described hereinafter. Line H, intersecting region F at point K, portrays the terminal E2 load line in accordance with the ring circuit shown in Fig. 3.

Referring to Fig. 3 there is disclosed the arrangement of a 50-stage ring counter in accordance with the invention in which four of the stages, namely stages 1, 2, 3 and 50, enclosed in blocks 1, 2, 3 and 50, are shown. Each stage is substantially identical and comprises a pair of junction transistors 11 and 21, 12 and 22, 13 and 23 and 14 and 24 for stages 1, 2, 3 and 50. Transistors 11, 12, 13 and 14 are PNP junction transistors having emitters 31, 32, 33 and 34, bases 41, 42, 43 and 44 and collectors 51, 52, 53 and 54, respectively, and transistors 21, 22, 23 and 24 are NPN junction transistors having emitters 61, 62, 63 and 64, bases 71, 72, 73 and 74 and collectors 81, 82, 83 and 84, respectively. Collectors 51, 52, 53 and 54 and collectors 81, 82, 83 and 84 are connected, respectively, to bases 71, 72, 73 and 74 and to bases 41, 42, 43 and 44 to form the previously-described "hook" connections. Emitters 31, 32, 33 and 34 and emitters 61, 62, 63 and 64 are connected, respectively, to common lead 101 and to negative battery or voltage sources E31, E32, E33, E34, respectively. Bases 41, 42, 43 and 44 and collectors 81, 82, 83 and 84, respectively, are connected to ground through resistors R11, R12, R13 and R14 and collectors 51, 52, 53 and 54 and bases 71, 72, 73 and 74 are connected to negative voltage sources E41, E42, E43 and E44 through resistors R21, R22, R23 and R24, respectively. The magnitude of voltage sources E41, E42, E43 and E44 is more negative than voltage sources E31, E32, E33 and E34 and it is thus seen that each stage has a current voltage characteristic which takes the form of the previously-described curve shown in Fig. 2 wherein stable region A and stable region F flank current threshold region B and negative resistance region D. Collectors 81, 82 and 83 of each stage is interconnected with bases 72, 73 and 74 of the next successive stage and collector 84 of stage 50 is interconnected with base 71 of stage 1 through condensers C11, C12, C13, C14 whereby a closed ring is formed.

Negative or reverse current pulses are supplied to common lead 101 from a conventional pulse generator, not shown, through terminal 109 and condenser 107.

Current source or battery 111 supplies current through resistor 103 to lead 101 and a portion of the current supplied to lead 101 is shunted through thermistor 105 to negative battery 113. The magnitude of the voltages of batteries 111 and 113 and the resistances of resistor 103 and thermistor 105 are such that with one of the stages conducting the sum of the leakage currents from the emitters 31, 32, 33 and 34 of the 49 off stages to lead 101 plus the current through resistor 103 to lead 101 less the current shunted from lead 101 to battery 113 through thermistor 105 exceeds the maximum current required to saturate the conducting stage but is insufficient to overcome the current thresholds of two stages. Therefore, two stages cannot be on at one time. The input to emitters 31, 32, 33 or 34 of the conducting stage is shown as load line H in Fig. 2. Point K at the intersection of stable region F and load line H indicates the stable current voltage input characteristic of the on stage. It is apparent from inspection of Fig. 2 that the available input current at point K is adequate to maintain the on stage in stable region F despite the variations in the transistor characteristics but inadequate to maintain two stages on simultaneously. Thus, the remaining 49 stages are maintained off and their input characteristics must lie in stable region A at the voltage level of lead 101.

Typical operation of the circuit shown in Fig. 3 will now be described. Assuming stage 1 is on and the remaining 49 stages are off, transistors 11 and 21 are conducting and collector 81 is negative relative to ground due to the current drawn by collector 81 from ground via resistor R11. When a negative current pulse is applied to lead 101 via terminal 109 and condenser 107, condenser 107 draws current to its plate from lead 101 thereby lowering the voltage level of lead 101 below the level of collector 81 and base 41 and reducing the available current to lead 101 below the minimum threshold current required to maintain stage 1 on. Transistor 11 and transistor 21 turn off and the voltage on collector 81 rises to ground. The positive voltage transition of collector 81 is applied to base 72 of transistor 22 in stage 2 through condenser C12 overcoming the back-bias applied to base 72 by battery E42 and turning transistor 22 on. In conducting, current flows from ground to collector 82 of transistor 22 by way of resistor R12 driving the voltage of collector 82 and base 42 of transistor 12 negative, relative to ground, to a voltage slightly positive relative to the negative voltage of battery E32 applied to emitter 62. When the reverse current pulse on terminal 101 is removed, the voltage on lead 101 starts to rise as condenser 107 is charged by battery 111 through resistor 103. When the voltage on lead 101 exceeds the voltage on base 42, transistor 12 conducts and clamps the lead 101 voltage to a level slightly positive relative to collector 52 which, in turn, is slightly positive relative to emitter 62. No other stage can switch into the on condition because the base of each of the other transistors 11, 13 and 14, with transistors 21, 23 and 24 nonconducting, are at the ground level. For this condition to be realized, the affect of the positive pulse on the lower plate of condenser 12 as shown in Fig. 3 must persist longer than the negative current pulse applied to lead 101 via terminal 109 and condenser 107. This procedure is repeated whereby each of the stages conduct successively upon the application of the reverse current pulses.

There exists the problem of increased leakage of the 49 stages in the off condition at elevated ambient temperatures since the leakage current to lead 101 from each of emitters 11, 12, 13 and 14 increases with the increase of the ambient temperature. However, as the temperature increases, the equivalent resistance of thermistor 105 in the current shunt path from lead 101 to negative battery 113 decreases and thus increases the amount of current shunted away from lead 101. Thus, as the temperature increases, the increase of the leakage current applied to lead 101 is compensated by the increase of the current shunted away from lead 101 to battery 113.

The possibility of no stage being on when power is turned on or where the available input current to emitters 31, 32, 33 and 34 divides itself among several stages so that no stage has sufficient current to turn itself on is avoided by modifying stage 1 by connecting negative battery E110 to base 41 through resistor R110. This forms a voltage divider comprising, in series, negative battery E110, resistor R110, resistor R11 and ground and lowers the voltage on base 41, which is connected to the junction of resistor R110 and resistor R11, to a value slightly negative relative to ground. This provides a change in the emitter to base bias of transistor 11 in the forward direction and thus lowers the voltage level of current threshold region B, Fig. 2, of stage 1 whereby, when the voltage on lead 101 rises with all the stages in the off condition, stage 1 takes all the available current from lead 101 and turns on before the voltage on lead 101 rises to ground and any of the other stages can turn on. Thus, with no stage on, the ring is started or restarted by turning on stage 1.

In the tested embodiment of Fig. 3, the indicated components were designated to have the following values:

| | | |
|---|---|---|
| Battery **111** | volts | 50 |
| Battery **113** | do | 40 |
| Batteries E31, E32, E33, E34 | do | 12 |
| Batteries E41, E42, E43, E44 | do | 15 |
| Battery E110 | do | 15 |
| Resistor **103** | ohms | 7,000 |
| Resistors R11, R12, R13, R14 | do | 750 |
| Resistors R21, R22, R23, R24 | do | 750 |
| Resistor R110 | do | 12,100 |
| Thermistor **105** | ohms at 25° C. | 20,400 |
| Condensers **107**, C11, C12, C13, C14 | microfarads | .01 |

In conjunction with the circuit shown in Fig. 3, a negative pulse source having a pulse repetition rate of 6700 pulses per second was employed.

The specific embodiment of this invention shown and described herein is by way of illustration only and should not be considered as limited thereto, but capable of modification without departing from the spirit of the invention and within the scope of the appended claims.

What is claimed is:

1. A transistor counter circuit for junction transistors having amplification factors which differ from an upper extreme approaching unity and a lower extreme of not greater than .9 comprising a plurality of bisable current-conducting stages each including a pair of transistors of opposite conductivity type and each of said transistors having a base, an emitter and a collector, a connection from the base of each transistor of each of said stages to the collector of the other whereby the minimum emitter current conduction of one of said transistors required to maintain said pair of transistors conductive varies due variations in the amplification factors of said transistors, a source of reverse-biasing voltage connected across the collector and the base of the other transistor of each of said stages, a source of back-biasing voltage, impedance means connected in series with said back-biasing voltage across the base and the emitter of said other transistor for limiting the extremes of said minimum emitter current of said one transistor within the ratio of two to one, said impedance means including a resistor having a sufficiently small magnitude for substantially increasing the said minimum emitter current, a voltage pulse transfer and storage circuit interconnecting the collector of said other transistor and the base of said other transistor of the next subsequent one of said stages for overcoming said back-biasing voltage source connected to said other transistor of said subsequent stage, a common pulse supply means connected to the emitters of said one of said transistors for rendering said stages nonconducting and a limited-current source connected to the emitters of said ones of said transistors.

2. A counter circuit in accordance with claim 1 wherein said limited-current source includes an impedance in shunt thereto whose resistance varies inversely with the change of abient temperature.

3. A transistor ring counter for junction transistors having amplification factors which differ from an upper extreme approaching unity and a lower extreme of not greater than .9 comprising a loop of bistable current-conducting stages each including a PNP junction transistor and an NPN junction transistor and each of said transistors having a base, an emitter and a collector, a connection from the base of each transistor of each of said stages to the collector of the other whereby the minimum emitter current conduction of said PNP transistor required to maintain said pair of transistors conductive varies due to variations in the amplification factors of said transistors, a source of reverse-biasing voltage connected across the collector and the base of each of said NPN transistors, a source of back-biasing voltage, impedance means connected in series with said back-biasing voltage across the base and the emitter of said NPN transistor for limiting the extremes of said minimum emitter current of said PNP transistor within the ratio of two to one, said impedance means including a resistor having a sufficiently small magnitude for substantially increasing the said minimum emitter current conduction of said PNP transistor, a voltage pulse transfer and storage circuit interconnecting the collector of said NPN transistor and the base of said NPN transistor of the next subsequent one of said loop of stages for overcoming said back-biasing voltage source connected to said NPN transistor of said subsequent stage, a common pulse supply means connected to the emitters of said PNP transistors for periodically back-biasing said emitters of said PNP transistors and thereby rendering said stages nonconductive, a limited-current source connected to the emitters of said PNP transistors and biasing means individual to a predetermined one of said stages connected across the base and the emitter of said PNP transistor of said one stage, said baising means comprising a voltage source poled to oppose said pulse supply means.

References Cited in the file of this patent

UNITED STATES PATENTS

| | | |
|---|---|---|
| 2,764,643 | Sulzer | Sept. 25, 1956 |
| 2,829,257 | Root | Apr. 1, 1958 |
| 2,904,758 | Miranda | Sept. 15, 1959 |

FOREIGN PATENTS

| | | |
|---|---|---|
| 200,400 | Australia | Dec. 7, 1955 |
| 753,689 | Great Britain | July 25, 1956 |